(12) United States Patent
Lakrimi

(10) Patent No.: US 9,837,190 B2
(45) Date of Patent: Dec. 5, 2017

(54) METHODS FOR FORMING JOINTS BETWEEN MAGNESIUM DIBORIDE CONDUCTORS

(71) Applicant: M'Hamed Lakrimi, Oxford (GB)

(72) Inventor: M'Hamed Lakrimi, Oxford (GB)

(73) Assignee: Siemens Healthcare Limited, Frimley, Camberley (GB)

( * ) Notice: Subject to any disclaimer, the term of this patent is extended or adjusted under 35 U.S.C. 154(b) by 0 days.

(21) Appl. No.: 14/372,272

(22) PCT Filed: Nov. 16, 2012

(86) PCT No.: PCT/EP2012/072869
§ 371 (c)(1),
(2) Date: Jul. 15, 2014

(87) PCT Pub. No.: WO2013/107537
PCT Pub. Date: Jul. 25, 2013

(65) Prior Publication Data
US 2014/0364318 A1 Dec. 11, 2014

(30) Foreign Application Priority Data
Jan. 20, 2012 (GB) .................................. 1200989.0

(51) Int. Cl.
| | | |
|---|---|---|
| *H01L 39/24* | (2006.01) | |
| *H01B 12/06* | (2006.01) | |
| *B62D 15/02* | (2006.01) | |
| *G06K 9/00* | (2006.01) | |
| *G06T 7/73* | (2017.01) | |

(52) U.S. Cl.
CPC ............ *H01B 12/06* (2013.01); *B62D 15/027* (2013.01); *G06K 9/00798* (2013.01); *G06K 9/00812* (2013.01); *G06T 7/73* (2017.01); *G06T 2207/30264* (2013.01)

(58) Field of Classification Search
CPC ...................................................... H01B 12/06
USPC ......................................... 505/230, 925, 926
See application file for complete search history.

(56) References Cited

U.S. PATENT DOCUMENTS

| | | | |
|---|---|---|---|
| 4,261,934 A * | 4/1981 | Hart ........................ | C04B 35/51 |
| | | | 264/0.5 |
| 6,787,504 B2 | 9/2004 | Romonovich et al. | |
| 8,897,846 B2 | 11/2014 | Drechsler et al. | |
| 2003/0127051 A1 * | 7/2003 | Fritzemeier et al. ......... | 118/715 |
| 2004/0092403 A1 | 5/2004 | Zhao et al. | |
| 2004/0204321 A1 | 10/2004 | Gumbel et al. | |
| 2006/0063680 A1 * | 3/2006 | Ignatiev et al. .............. | 505/329 |
| 2007/0209516 A1 | 9/2007 | Hirose | |
| 2008/0236869 A1 * | 10/2008 | Marte et al. ................ | 174/125.1 |
| 2009/0062128 A1 | 3/2009 | Harada et al. | |
| 2009/0258787 A1 * | 10/2009 | Wilkie et al. ................. | 505/231 |
| 2010/0190649 A1 * | 7/2010 | Doll et al. .................... | 505/220 |
| 2010/0216647 A1 | 8/2010 | Tenbrink et al. | |
| 2011/0224085 A1 * | 9/2011 | Karau ..................... | C01B 35/04 |
| | | | 505/433 |
| 2012/0172234 A1 | 7/2012 | Frantti et al. | |

FOREIGN PATENT DOCUMENTS

| | | | | |
|---|---|---|---|---|
| CN | 101291021 A | | 10/2008 | |
| EP | 1 394 112 | | 3/2004 | |
| EP | 2 264 799 | | 12/2010 | |
| GB | 1200989.0 | * | 1/2012 | ............ H01B 12/06 |
| JP | H09174259 A | | 7/1997 | |
| JP | 2003086265 A | | 3/2003 | |
| WO | 2009/127956 | | 10/2009 | |

OTHER PUBLICATIONS

Li et al., "High Criticial Current Joint of MgB2 tapes Using Mg and B Powder Mixture as Flux," Superconductor Science and Technology vol. 21 (2008) pp. 1-5.
Weijun et al., "A Superconducting Joint Technique for MgB2 Round Wires," IEEE Trans Appl Supercond., vol. 19, No. 3, pp. 2261-2264 (2009).

* cited by examiner

*Primary Examiner* — Paul Wartalowicz
(74) *Attorney, Agent, or Firm* — Schiff Hardin LLP

(57) ABSTRACT

In a method for forming joints between $MgB_2$ filaments of superconducting wires, the $MgB_2$ filaments from the wires to be joined are exposed, and the exposed filaments are then exposed to a mixture of magnesium powder and boron powder in a furnace, and the $MgB_2$ filaments and the magnesium and boron powders are pressed together in the furnace. The $MgB_2$ filaments and the magnesium and the boron powders in the furnace are heated, and oxygen that is present within the furnace is preferentially trapped, and thus removed from the joint, by providing titanium within the furnace.

5 Claims, No Drawings

METHODS FOR FORMING JOINTS BETWEEN MAGNESIUM DIBORIDE CONDUCTORS

BACKGROUND OF THE INVENTION

Field of the Invention

The present invention relates to a method for forming joints between magnesium diboride ($MgB_2$) conductors.

Description of the Prior Art

Magnesium diboride ($MgB_2$) is used as a superconductor for example as filaments in wires used to make superconducting magnets for imaging systems such as MRI systems. The wire must be cryogenically cooled in order to become superconducting.

It has been found difficult to make adequate joints between $MgB_2$ filaments. Either the joints do not become superconducting even at the temperature of operation, or the joints become resistive (known as "quenching") at an unacceptably low background magnetic field strength or when a current exceeding an unacceptably low threshold is passed.

A typical known process for forming $MgB_2$ joints involves exposing $MgB_2$ filaments from the wires to be joined, pressing them together and exposing them to magnesium powder and boron powder in a mold in a furnace at a temperature in excess of or of order 540° C., under vacuum for outgassing. The powders are mixed and pressed to maximize the density of the resultant $MgB_2$ joint. For example, a weight of 2-30 tons may be used to compress the powders. The compression aims to prevent the resulting joint from being porous, which would reduce the effectiveness of the joint. The temperature is selected to be slightly below the melting point of magnesium or boron, such that the powders do not actually melt, but may be effectively compressed. The elevated temperature ensures that the reaction to produce $MgB_2$ continues at a reasonable rate.

This process results in the deposition of $MgB_2$ on the filaments, providing a joint comprising $MgB_2$ from the filaments of one wire to the filaments of the other wire. In alternative methods, the pressure may be maintained during the heat treatment step, or the pressure may be released once the powders have been compressed, and before the heat treatment step.

In such methods of preparation, the powders are typically made up of particles of approximately 25 μm diameter. During the heat treatment step, the Mg and B react together to form a layer of $MgB_2$, about 2 to 5 μm thick, on the surfaces of the Mg particles. Superconduction between the $MgB_2$ filaments of the joined wires takes place through these surface layers of $MgB_2$. The compression step is required to ensure that the particles are in close contact, to provide an effective conduction path. The heat treatment is carried out at a temperature below the melting point of either Mg or B, but at a high enough temperature that the reaction to create $MgB_2$ occurs at a reasonable rate.

In a typical $MgB_2$ superconducting wire, several $MgB_2$ cores are provided, each sheathed in a protective layer, for example layer of iron, or niobium, or MONEL® alloy. The sheathed cores are then encased in a copper outer to provide mechanical strength and an alternative electrical pathway in case of quench in the $MgB_2$ cores. The sheaths are necessary to prevent the $MgB_2$ cores from reacting with the copper outer, and to provide mechanical strength to the cores during manufacture of the wire. $MgB_2$ is known to be brittle, and will shatter if bent too far.

Conventional jointing processes have included stripping the protective layer from the cores. The exposed cores are then placed in the mold with magnesium and boron powders, as described above, for jointing. Alternatively, the protective layer is not stripped, but the filaments, each comprising an $MgB_2$ core and a protective layer, are cut, or shaved, at a shallow angle such as 2°-5° angle, to expose the core over a relatively large surface area. In an example, the core may be exposed over a length of some 40 mm. These filaments are then placed in a mold with the magnesium and boron powders as described above.

While theoretically attractive, such $MgB_2$ persistent joints have proven to be very difficult to realize. One of the limiting factors is the amount of magnesium oxides found in the deposited $MgB_2$ of the joint. Joints contaminated with magnesium oxides have been found not persistent, that is to say, not superconducting, even with a background magnetic field of 0 T.

It is believed that oxygen outgasses into the vacuum furnace from magnesium oxides present in the magnesium powder used in the process, and possibly also from the structure of the furnace itself. Magnesium oxide MgO dissociates into magnesium and oxygen at a temperature, much below that typically employed to achieve $MgB_2$ formation according to the method described herein.

Conventional methods of joining $MgB_2$ wires comprise the steps of:
 exposing at least one $MgB_2$ filament in each of the wires to be joined;
 placing the exposed $MgB_2$ filaments in a mold;
 adding magnesium and boron powders into the mold;
 mechanically pressing the powders in the mold; and
 heat treating the filaments and powders to produce an $MgB_2$ joint extending between the filaments of the joined wires.

SUMMARY OF THE INVENTION

The present invention relates to the final step in the method described above. During the heat treatment step, any free oxygen within the furnace is likely to react with the magnesium powder to form MgO, or a complex magnesium-boron-oxide.

The present invention provides a method for forming joints between $MgB_2$ conductors in which oxygen is effectively removed from the environment within the furnace while the joints are formed.

DESCRIPTION OF THE PREFERRED EMBODIMENTS

According to the method of the present invention, titanium is provided, preferably in the form of pellets, within the furnace while the joint is formed. The titanium acts as a getter of oxygen, and any oxygen which may be present in the furnace will be preferentially trapped by the titanium to become titanium oxide, rather than reacting with the magnesium. The titanium is placed in close proximity to the jointing mold, so that the oxygen is quickly and efficiently removed from the joint. The entrapment of free oxygen by the titanium avoids any contamination of the joint with magnesium oxides, leading to persistent $MgB_2$ joints which are acceptably tolerant of background magnetic field strength and current density.

The remaining stages in the method are unchanged. The method of the present invention may be applied in arrangements in which mechanical pressure is maintained during the jointing process, or in arrangements where the mechanical pressure is released during jointing.

The furnace may be evacuated by a vacuum pump, preferably to the order of $10^{-7}$ bar (0.01 Pa), or may be provided with an inert flush arrangement to reduce the amount of oxygen which needs to be trapped by the titanium.

Accordingly, the present invention provides the use of titanium pellets to capture any oxygen which may be present during the heat treatment of magnesium and boron powders to realize $MgB_2$ formation for the jointing of $MgB_2$ wires. Preferably, a high-vacuum pump is provided for evacuating the furnace, and this will remove some of the oxygen. Remaining oxygen will be preferentially trapped by the titanium, avoiding the formation of magnesium oxides.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for forming a joint between $MgB_2$ filaments of superconductive wires, comprising the steps of:
   at a location of said joint, exposing $MgB_2$ filaments from the wires to be joined;
   pressing the exposed $M_gB_2$ filaments together with a mixture of magnesium powder and boron powder in a mold with the exposed $MgB_2$ filament being exposed to the mixture of magnesium powder and boron powder in said mold;
   placing the mold in a furnace and placing titanium in said furnace in proximity to said mold; and
   heating the $MgB_2$ filaments and the magnesium and the boron powders in the mold in the furnace, and thereby causing oxygen to be outgassed from magnesium powder in the mold and from the furnace, and gettering the outgassed oxygen with said titanium within the furnace to produce titanium oxide, and thereby preventing the outgassed oxygen from reacting with magnesium in said furnace at said location of said joint.

2. A method according to claim 1 comprising providing the titanium in the furnace as pellets.

3. A method according to claim 1 wherein the furnace is evacuated by a vacuum pump while forming said joint in said furnace.

4. A method according to claim 1 comprising pressing the $MgB_2$ filaments and the magnesium and the boron powders together by applying a pressure in said mold, and maintaining said pressure during said heating.

5. A method according to claim 1 comprising pressing the $MgB_2$ filaments and the magnesium and the boron powders together by applying a pressure in said mold, and releasing said pressure before said heating.

* * * * *